United States Patent [19]

Jinbo

[11] Patent Number: 5,239,211

[45] Date of Patent: Aug. 24, 1993

[54] OUTPUT BUFFER CIRCUIT

[75] Inventor: Toshikatsu Jinbo, Tokyo, Japan

[73] Assignee: NEC Corporation, Tokyo, Japan

[21] Appl. No.: 709,190

[22] Filed: Jun. 3, 1991

[30] Foreign Application Priority Data

Jun. 4, 1990 [JP] Japan .................. 2-145718

[51] Int. Cl.$^5$ .................. H03K 17/16; H03K 19/20
[52] U.S. Cl. .................. 307/443; 307/451; 307/263
[58] Field of Search .............. 307/443, 263, 451, 553, 307/554

[56] References Cited

U.S. PATENT DOCUMENTS

4,890,017 12/1989 Masuda et al. .................. 307/451
4,973,865 11/1990 Haq .................. 307/443
5,010,256 4/1991 Dicke .................. 307/443

Primary Examiner—Edward P. Westin
Assistant Examiner—Andrew Sanders
Attorney, Agent, or Firm—Leydig, Voit & Mayer

[57] ABSTRACT

An output buffer circuit includes a first MOSFET provided between a power supply and an output data terminal and a second MOSFET provided between the output data terminal and the ground. The first and second MOSFETs become ON or OFF state in accordance with outputs of first and second inverter circuits which are controlled by an output potential detecting circuit which detects an output level of the output buffer circuit to avoid the decrease of the ground potential level.

4 Claims, 13 Drawing Sheets

OUTPUT BUFFER CIRCUIT

FIELD OF THE INVENTION

This invention relates to an output buffer circuit, and more particularly to, an output buffer circuit for preventing changes of a power supply potential in a semiconductor device.

BACKGROUND OF THE INVENTION

A conventional output buffer circuit comprises a NOR circuit, a NAND circuit, a p-type metal-oxide-silicon field effect transistor (P-MOSFET), an n-type MOSFET (N-MOSFET), and first and second inverter circuits.

In operation, when a data signal changes from a high level to a low level, outputs of the NOR and NAND circuits become a high level. The first and second inverter circuits supply the P-MOSFET and the N-MOSFET with inverted signals of a low level, so that the P-MOSFET becomes ON state while the N-MOSFET becomes OFF state. As a result, the output data signal is charged up to become high.

On the other hand, when the data signal changes from a low level to a high level, the outputs of the NOR and NAND circuits become a low level. The first and second inverter circuits supply the P-MOSFET and the N-MOSFET with inverted signals of a high level, so that the P-MOSFET becomes OFF state, while the N-MOSFET becomes ON state. As a result, the output data signal is discharged to become low.

According to the conventional output buffer circuit, however, there is a disadvantage in that the power supply potential level changes to cause the wrong operation of other circuits which are formed with the output buffer circuit on a semiconductor substrate and supplied with a power from an external common power supply. Such a change of the power supply potential is caused by parasitic inductances existing between the external common power supply of the semiconductor substrate and a power supply of the output buffer circuit, when the data signal changes from a low level to a high level, and to a low level again before the output data signal is completely discharged to be the ground potential level, as well explained later.

SUMMARY OF THE INVENTION

Accordingly, it is an object of the invention to provide an output buffer circuit in which potential changes of a power supply in the circuit is prevented.

According to a feature of the invention, an output buffer circuit including a first MOSFET provided between a first power supply and an output data terminal and a second MOSFET provided between a second power supply and the output data terminal. The output buffer circuit also includes a first inverter circuit for supplying a gate of the first MOSFET with a first potential and a second inverter circuit for supplying a gate of the second MOSFET with a second potential. A mechanism is provided for detecting a voltage of the output data terminal to generate a detecting signal. A controlling mechanism is provided for controlling the first and second inverter circuits in accordance with the detecting signal supplied from the detecting mechanism to avoid sudden changes of state in the first or second inverter circuit. The controlling mechanism includes either a resistor or a depletion-type MOSFET for delaying a timing of changing the first or second MOSFET from an on state to an off state.

BRIEF DESCRIPTION OF THE DRAWINGS

The invention will be explained in more detail in conjunction with appended drawings wherein.

DESCRIPTION OF THE PREFERRED EMBODIMENTS

Before describing an output buffer circuit in preferred embodiments according to the invention, the conventional output buffer circuit described before will be explained in conjunction with FIGS. 1 to 5.

Figure 1:
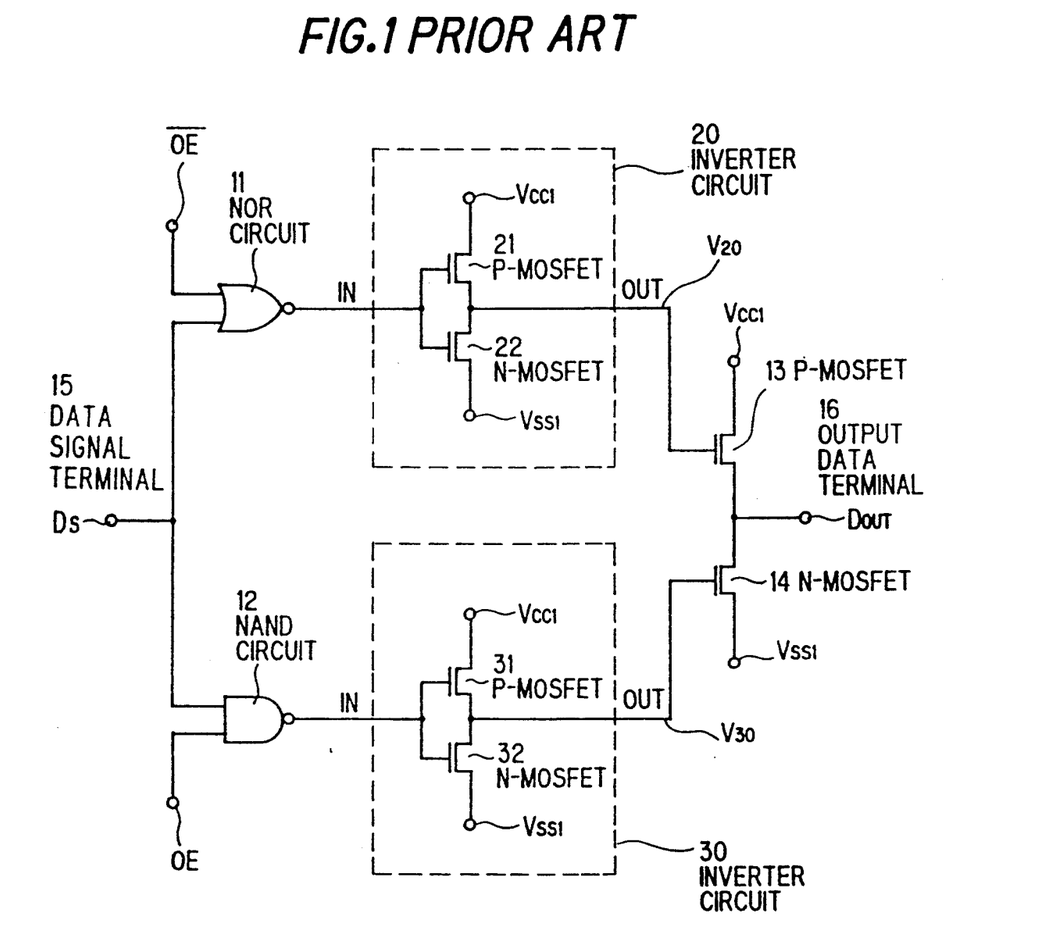
FIG. 1 is a circuitry diagram of a conventional output buffer circuit.

FIG. 1 is a circuitry diagram of a conventional output buffer circuit.

The conventional output buffer circuit comprises a NOR circuit 11, a NAND circuit 12, a P-MOSFET 13, an N-MOSFET 14, and inverter circuits 20 and 30.

The NOR circuit 11 is supplied with a data signal $D_S$ which is supplied from a data signal terminal 15 and an output enable signal $\overline{OE}$ which becomes low when the output buffer circuit operates.

The NAND circuit 12 is supplied with the data signal $D_S$ and an output enable signal OE which becomes high when the output buffer circuit operates.

The P-MOSFET 13 is connected at a gate to an output of the inverter circuit 20 from which an output potential $V_{20}$ is applied thereto, at a source to a power supply potential $V_{CC1}$ of the circuit, and at a drain to an output data terminal 16 by which an output data signal $D_{OUT}$ is supplied to an external circuit.

The N-MOSFET 14 is connected at a gate to an output of the inverter circuit 30 from which an output potential $V_{30}$ is applied thereto, at a source to a ground potential $V_{SS1}$ of the circuit, and at a drain to the output data terminal 16.

The inverter circuit 20 comprises a P-MOSFET 21 and an N-MOSFET 22. The P-MOSFET 21 and the N-MOSFET 22 are connected at gates to an output of the NOR circuit 11 and at drains to the gate of the P-MOSFET 13. The P-MOSFET 21 is connected at a source to the power supply potential $V_{CC1}$. The N-MOSFET 22 is connected at a source to the ground potential $V_{SS1}$.

The inverter circuit 30 comprises a P-MOSFET 31 and an N-MOSFET 32. The P-MOSFET 31 and the N-MOSFET 32 are connected at gates to an output of the NAND circuit 12 and at drains to the gate of the N-MOSFET 14. The P-MOSFET 31 is connected at a source to the power supply potential $V_{CC1}$. The N-MOSFET 32 is connected at a source to the ground potential $V_{SS1}$.

Figure 2:
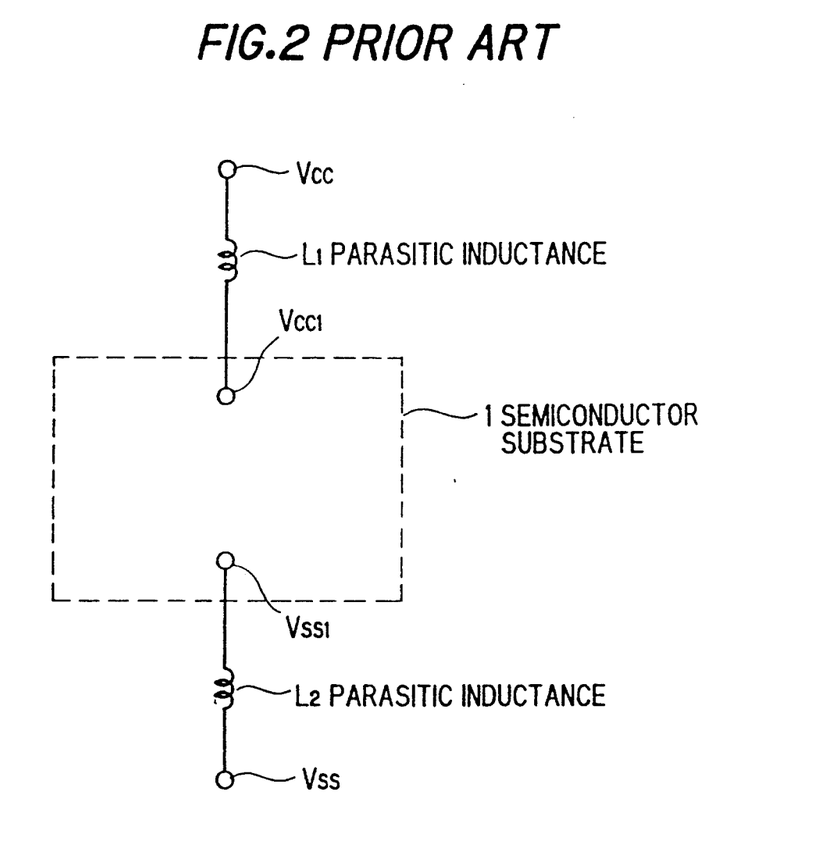
FIG. 2 is a circuitry diagram of an equivalent circuit of parasitic inductances in the conventional output buffer circuit.

FIG. 2 is a circuitry diagram of an equivalent circuit of parasitic inductances in the conventional output buffer circuit. The output buffer circuit is formed with other circuits on a semiconductor substrate 1 and is supplied with a power supply potential $V_{CC}$ and a ground potential $V_{SS}$ from an external power supply. In this circuit, there exist parasitic inductances $L_1$ and $L_2$ between the power supply potentials $V_{CC}$ and $V_{SS}$ and those of the output buffer circuit, that are $V_{CC1}$ and $V_{SS1}$.

Next, operation of the conventional output buffer circuit will be described in conjunction with FIGS. 3 to 5.

Figure 3:
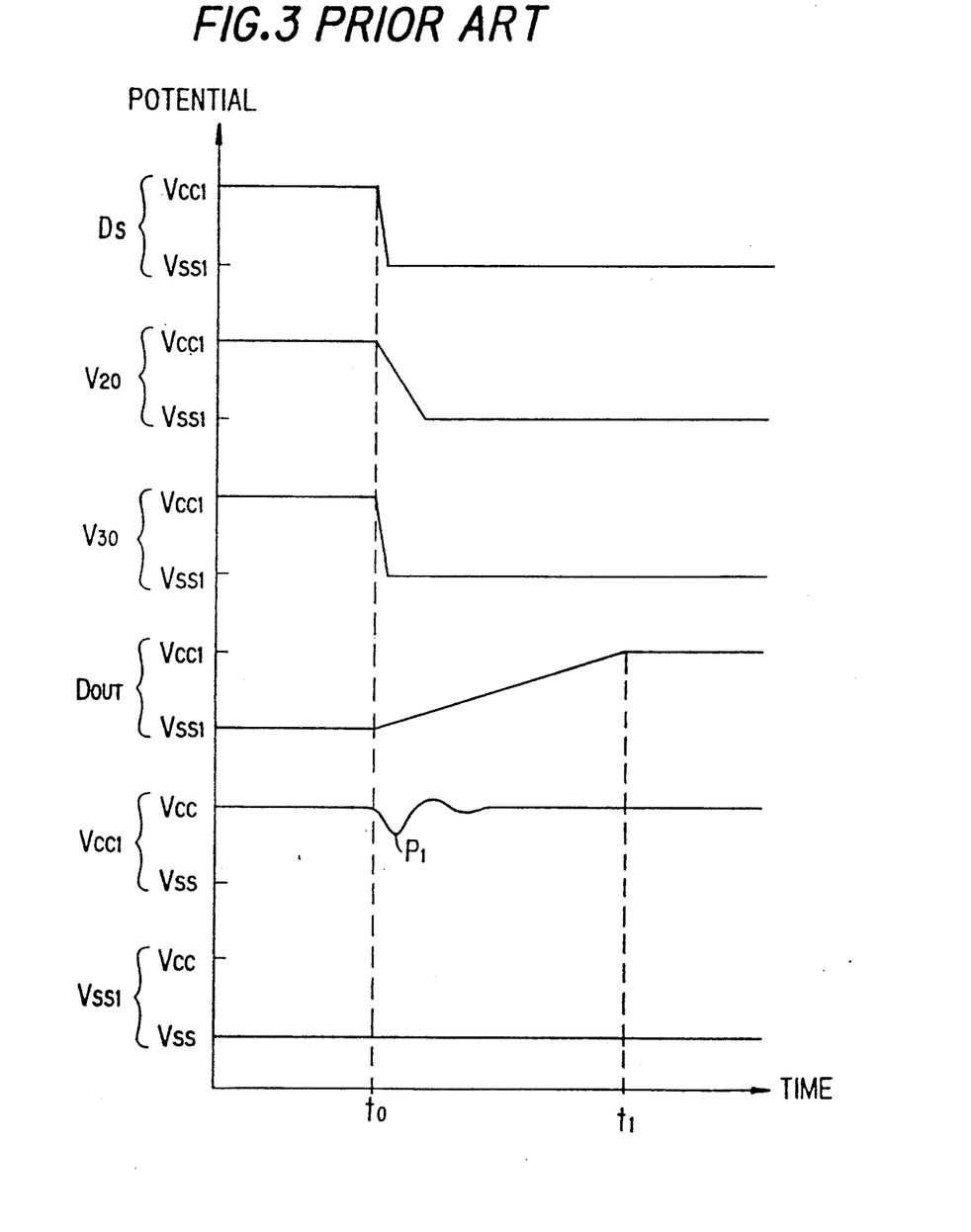
FIGS. 3 to 5 are diagrams of potential waveforms in operation of the conventional output buffer circuit.

In operation, when the data signal $D_3$ changes from the high level $V_{CC1}$ to the low level $V_{SS1}$ at the time $t_0$, as shown in FIG. 3, and the output enable signals $\overline{OE}$ and OE are at the low level and the high level, respectively, the outputs of the NOR and NAND circuits 11 and 12 become high from low. In the inverter circuit 20, the P-MOSFET 21 becomes OFF state and the N-MOSFET 22 becomes ON state, so that the output potential $V_{20}$ of the inverter circuit 20 changes from the high level $V_{CC1}$ to the low level $V_{SS1}$ to make the P-MOSFET 13 ON state. In the inverter circuit 30, the P-MOSFET 31 becomes OFF state and the N-MOSFET 32 becomes ON state, so that the output potential $V_{30}$ of the inverter circuit 30 changes from the high level $V_{CC1}$ to the low level $V_{SS1}$ to make the N-MOSFET 14 OFF state. As a result, the output data signal $D_{OUT}$ is charged up through the P-MOSFET 13 to become high from low at the time $t_1$.

In this situation, the power supply potential $V_{CC1}$ decreases, as indicated by $P_1$, when the output data signal $D_{OUT}$ becomes high from low, due to the existence of the parasitic inductances between the external and internal power supply potentials of the circuit. In order to avoid the decrease of the power supply potential $V_{CC1}$, an N-MOSFET having a small mutual transfer conductance is generally used as the N-MOSFET 22 to ease the change of the potential level of the gate of the P-MOSFET 13 in a transit state from OFF to ON so that a surge of a current into the P-MOSFET 13, which causes the decrease of the power supply potential $V_{CC1}$, may be prevented.

Figure 4:
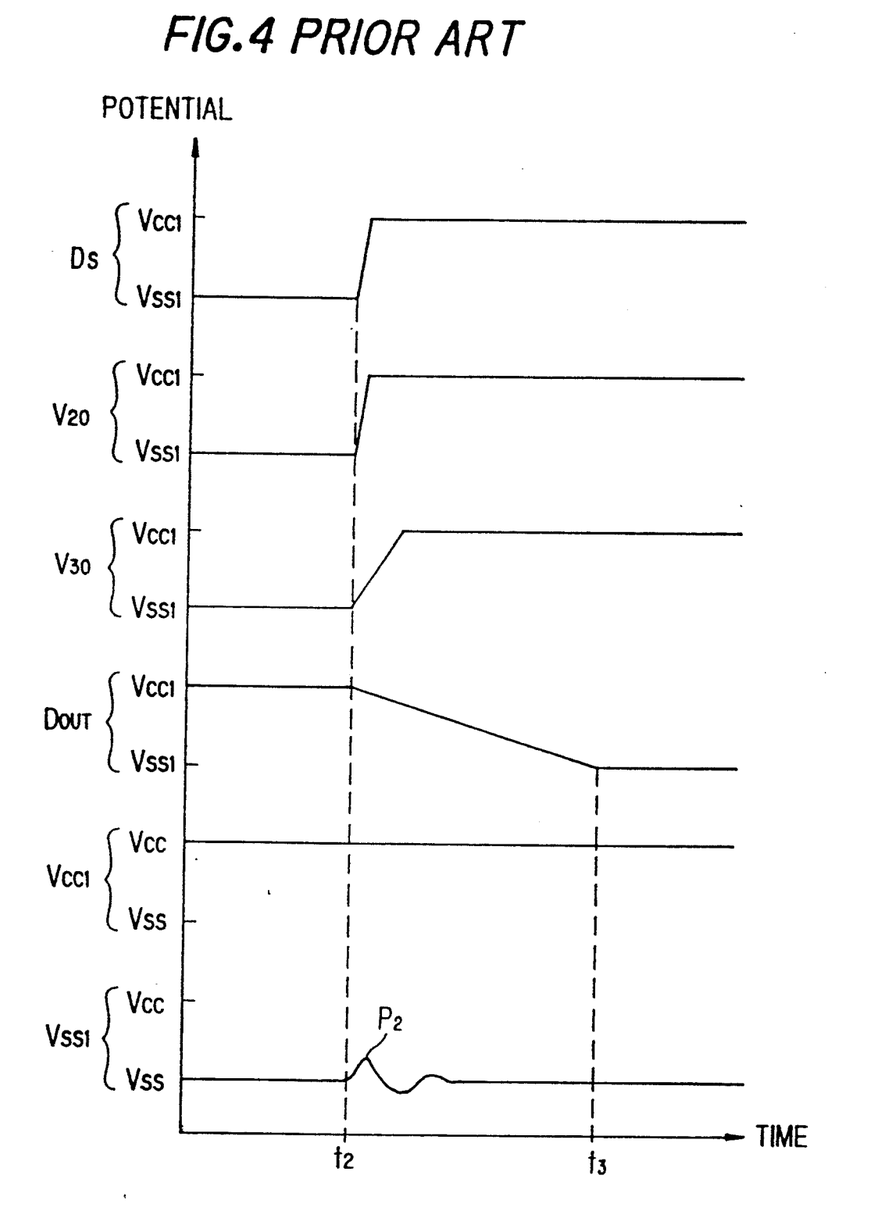

On the other hand, when the data signal $D_s$ changes from the low level $V_{SS1}$ to the high level $V_{CC1}$ at the time $t_2$, as shown in FIG. 4, the outputs of the NOR and NAND circuits 11 and 12 become low from high. In the inverter circuit 20, the P-MOSFET 21 becomes ON state and the N-MOSFET 22 becomes OFF state, so that the output potential $V_{20}$ of the inverter circuit 20 changes from the low level $V_{SS1}$ to the high level $V_{CC1}$ to make the P-MOSFET 13 OFF state. In the inverter circuit 30, the P-MOSFET 31 becomes ON state and N-MOSFET 32 becomes OFF state, so that the output potential $V_{30}$ of the inverter circuit 30 changes from the low level $V_{SS1}$ to the high level $V_{CC1}$ to make the N-MOSFET 14 ON state. As a result, the output data signal $D_{OUT}$ becomes low from high at the time $t_3$.

In this case, the ground potential $V_{SS1}$ increases, as indicated by $P_2$, when the output data signal $D_{OUT}$ becomes low from high. In order to avoid the increase of the ground potential $V_{SS1}$, a P-MOSFET having a small mutual transfer conductance is used as the P-MOSFET 31 to ease the change of the potential of the gate of the N-MOSFET 14 in a transit state from OFF to ON, so that a surge of a current into the N-MOSFET 14 may be prevented.

Figure 5:
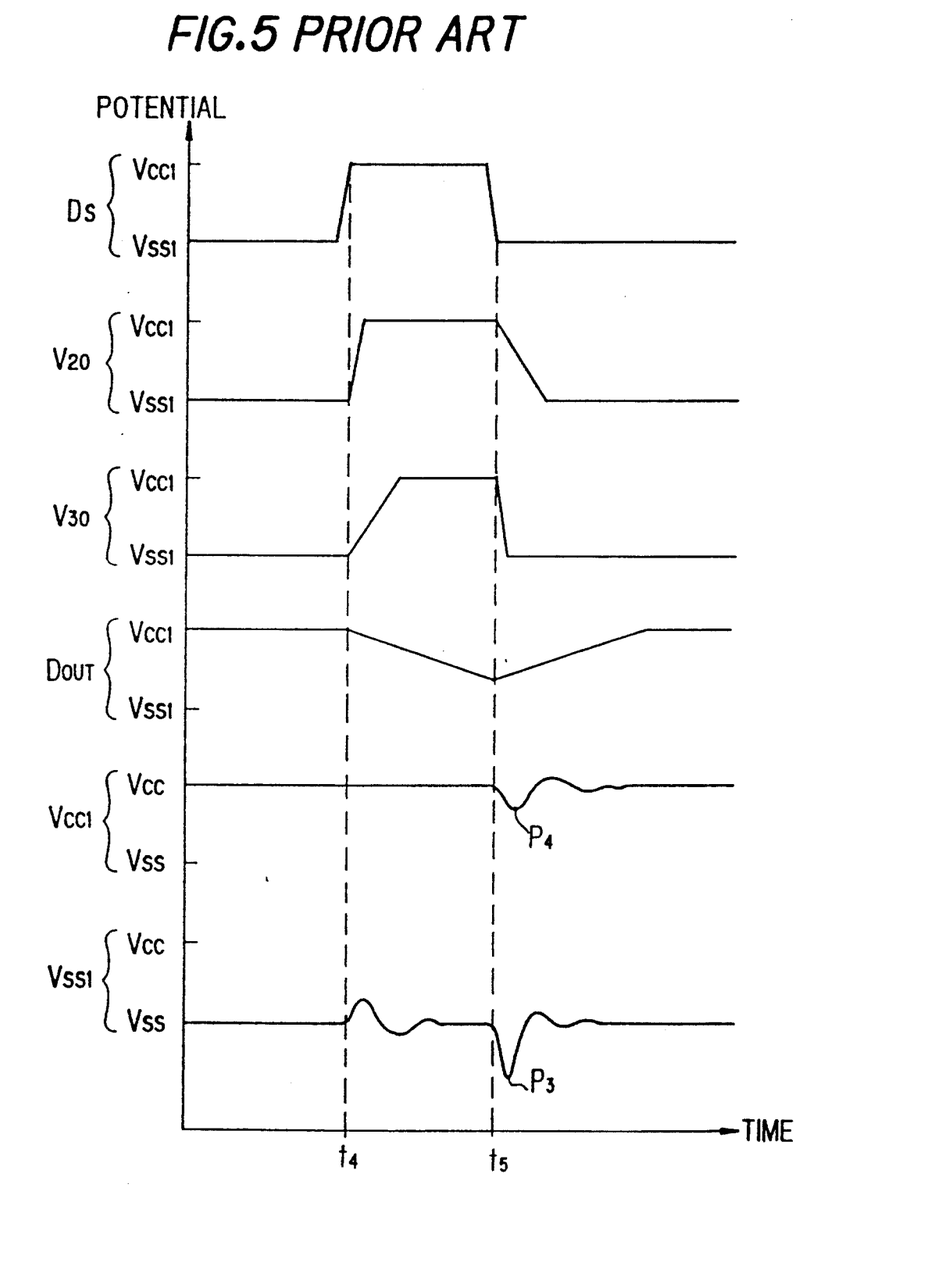

FIG. 5 shows a diagram of potential waveforms when the input data signal $D_S$ changes from the low level $V_{SS1}$ to the high level $V_{CC1}$ at the time $t_4$, and to the low level $V_{SS1}$ again at the time $t_5$. In this case, the output data signal $D_{OUT}$ is discharged through the N-MOSFET 14 due to the change of the data signal $D_S$ from low to high. However, the data signal $D_3$ changes from high to low before the output data signal $D_{OUT}$ is completely discharged to be the ground potential $V_{SS1}$, so that the N-MOSFET 14 becomes OFF state suddenly. Therefore, a current flowing from the ground potential $V_{SS1}$ to the external ground level $V_{SS}$ reduces suddenly, so that the ground potential $V_{SS1}$ decreases, as indicated by $P_3$, due to the parasitic inductance between the ground potential $V_{SS1}$ and the external ground potential $V_{SS}$, and simultaneously, the power supply potential $V_{CC1}$ decreases, as indicated by $P_4$, because the P-MOSFET 13 becomes ON state. As a result, other circuits which are formed on the common semiconductor substrate may operate wrongly.

Figure 6:
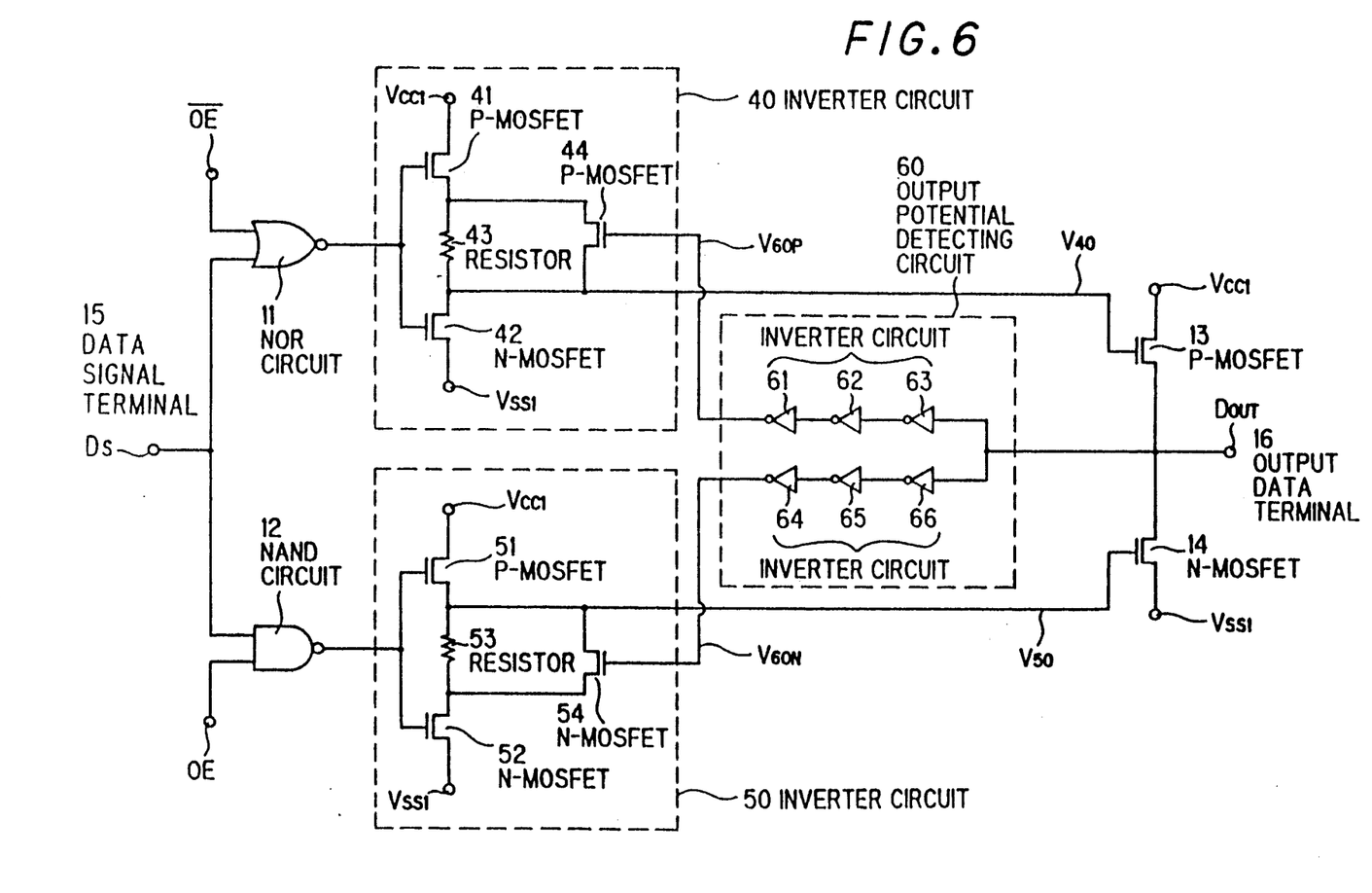
FIG. 6 is a circuity diagram of an output buffer circuit in a first preferred embodiment according to the invention.

Next, FIG. 6 is a circuitry diagram of an output buffer circuit in a first preferred embodiment according to the invention.

The output buffer circuit comprises a NOR circuit 11, a NAND circuit 12, a P-MOSFET 13, an N-MOSFET 14, inverter circuits 40 and 50, and an output potential detecting circuit 60.

The NOR circuit 11 is supplied with a data signal $D_3$ and an output enable signal $\overline{OE}$. The NAND circuit 12 is supplied with the data signal $D_3$ and an output enable signal OE.

The P-MOSFET 13 is connected at a gate to an output of the inverter circuit 40, at a source to a power supply potential $V_{CC1}$ of the circuit, and at a drain to an output data terminal 16.

The N-MOSFET 14 is connected at a gate to an output of the inverter circuit 50, at a drain to the output data terminal 16, and a source to the ground potential $V_{SS1}$.

The inverter circuit 40 comprises P-MOSFETs 41 and 44, an N-MOSFET 42, and a resistor 43. The P-MOSFET 41 is connected at a gate to an output of the NOR circuit 11, at a source to the power supply potential $V_{CC1}$, and at a drain to a source of the P-MOSFET 44 and a first terminal of the resistor 43. The N-MOSFET 42 is connected at a gate to the output of the NOR circuit 11, at a source to the ground potential $V_{SS1}$, and at a drain to the gate of the P-MOSFET 13 and a second terminal of the resistor 43. The P-MOSFET 44 is connected at a gate to a first output of the output potential detecting circuit 60, at a source to the drain of the P-MOSFET 41 and the first terminal of the resistor 43, and at a drain to the gate of the P-MOSFET 13.

The inverter circuit 50 comprises a P-MOSFET 51, N-MOSFETs 52 and 54, and a resistor 53. The P-MOSFET 51 is connected at a gate to an output of the NAND circuit 12, at a source to the power supply potential $V_{CC1}$, and a drain to the gate of the N-MOSFET 14, a drain of the N-MOSFET 54, and a first terminal of the resistor 53. The N-MOSFET 52 is connected at a gate to the output of the NAND circuit 12, at a source to the ground potential $V_{SS1}$, and at a drain to a source of the N-MOSFET 54 and a second terminal of the resistor 53. The N-MOSFET 54 is connected at a gate to a second output of the output potential detecting circuit 60, at a source to the drain of the N-MOSFET 52, and at a drain to the gate of the N-MOSFET 14.

The output potential detecting circuit 60 comprises first and second serial groups of inverter circuits. The first serial group comprises three inverter circuits 61 to 63 connected serially, in which an input of the inverter circuit 63 is connected to the output data terminal 16, and an output of the inverter circuit 61 which is the first output of the output potential detecting circuit 60 is connected to the gate of the P-MOSFET 44. The second serial group comprises three inverter circuits 64 to 66 connected serially, in which an input of the inverter circuit 66 is connected to the output data terminal 16 and an output of the inverter circuit 64 which is the second output of the output potential detecting circuit 60 is connected to the gate of the N-MOSFET 54.

In the output buffer circuit, there exist parasitic inductances $L_1$ and $L_2$ (not shown) between the external power supply potential $V_{CC}$ and the power supply potential $V_{CC1}$ of the output buffer circuit, and between the external ground potential $V_{SS1}$, as in the conventional output buffer circuit.

Next, operation of the output buffer circuit will be described in conjunction with FIGS. 7 to 9.

Figure 7:
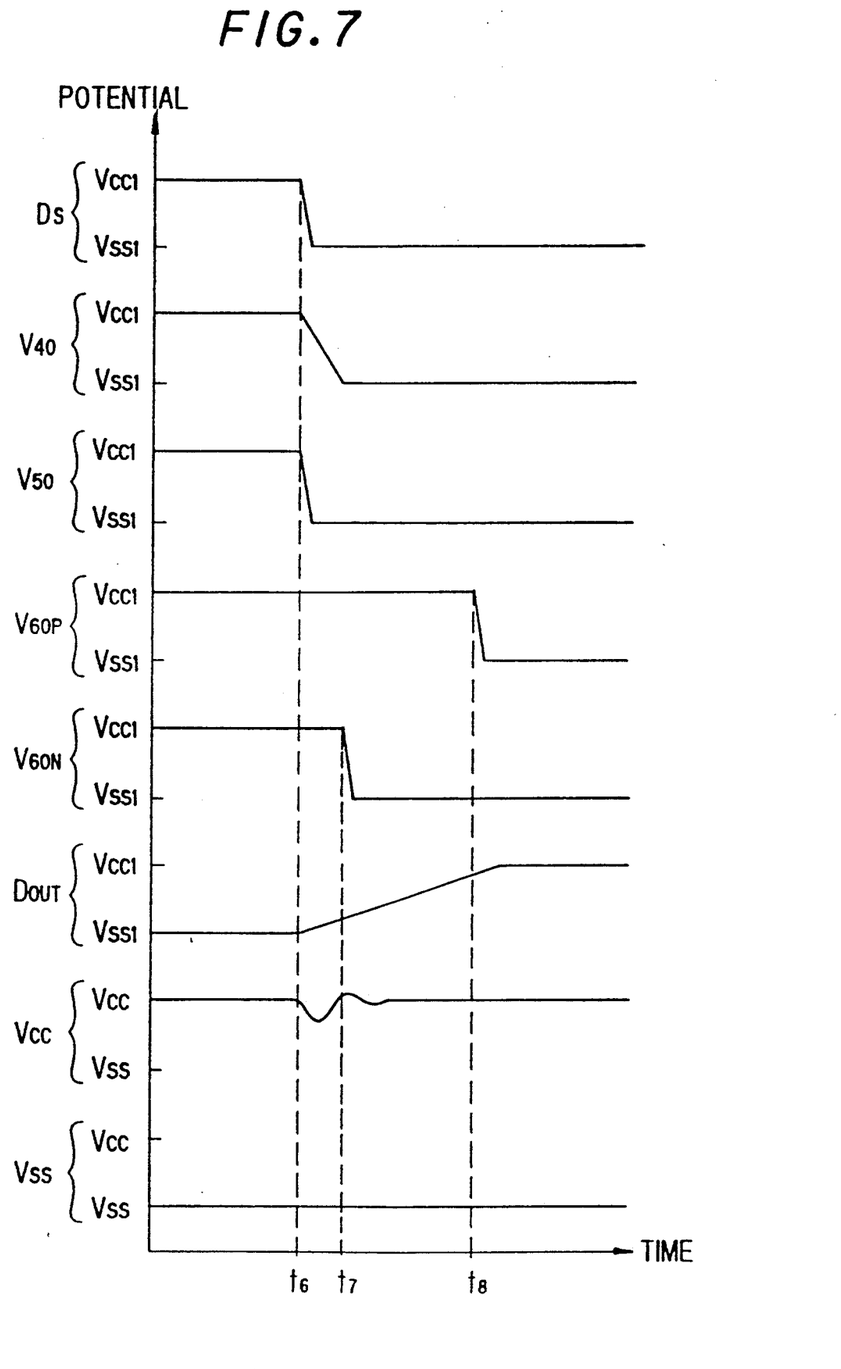
FIGS. 7 to 9 are diagrams of potential waveforms in operation of the first preferred embodiment according to the invention.

In operation, when the data signal $D_S$ changes from the high level $V_{CC1}$ to the low level $V_{SS1}$ at the time $t_6$, as shown in FIG. 7, the NOR and NAND circuits 11 and 12 supply the inputs of the inverter circuits 40 and 50 with signals of the high level, so that the output potentials $V_{20}$ and $V_{30}$ of the inverter circuits 40 and 50 become the low level $V_{SS1}$, respectively, to make the P-MOSFET 13 ON state and the N-MOSFET 14 OFF state. As a result, the output data signal $D_{OUT}$ becomes the high level $V_{CC1}$ from the low level $V_{SS1}$.

Figure 8:
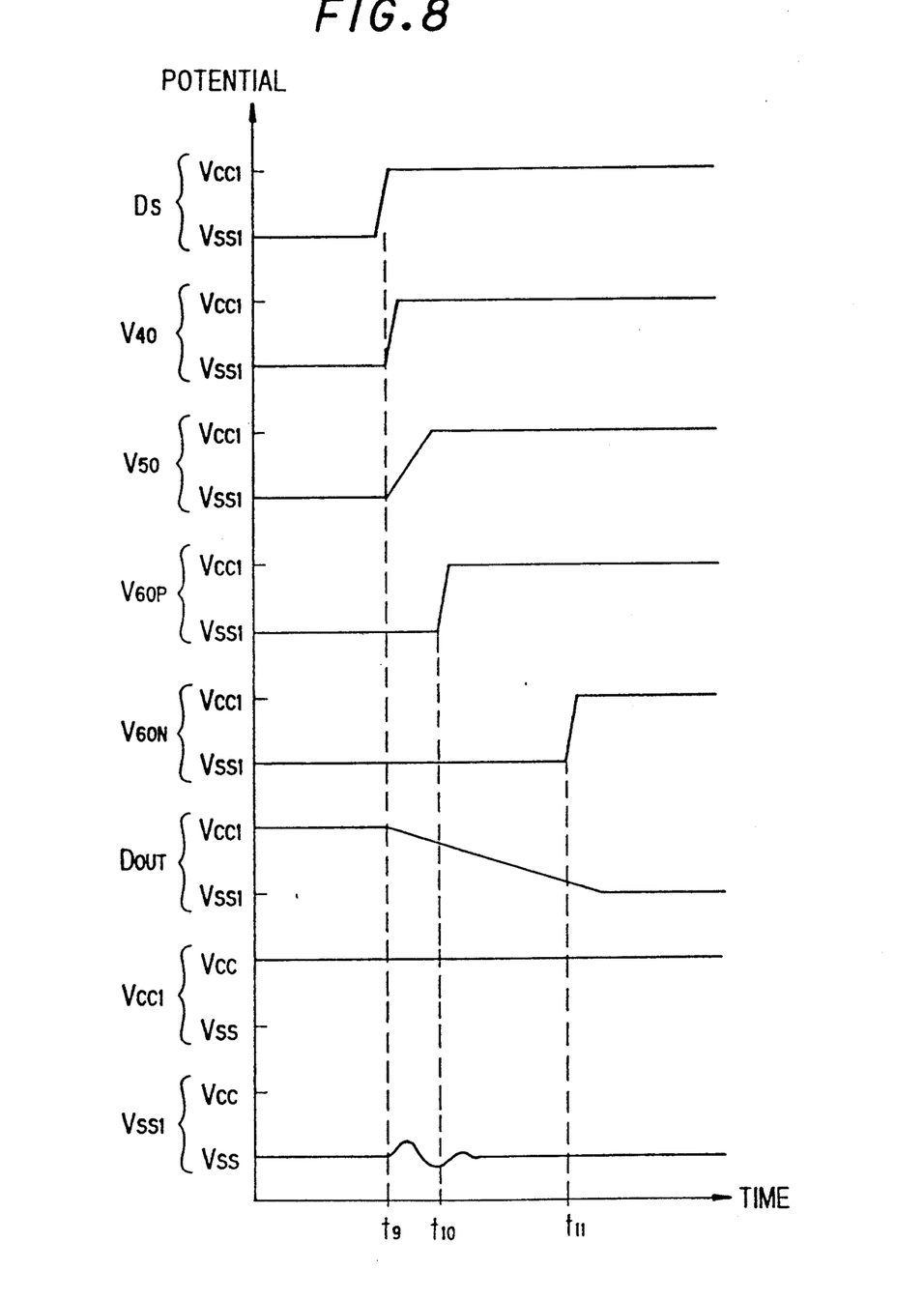

On the other hand, when the data signal $D_S$ changes from the low level $V_{SS1}$ to the high level $V_{CC1}$ at the time $t_9$, as shown in FIG. 8, the NOR and NAND circuits 11 and 12 supply the inputs of the inverter circuits 40 and 50 with signals of the low level, so that the output potentials $V_{20}$ and $V_{30}$ of the inverter circuits 40 and 50 become the high level $V_{CC1}$, respectively, to make the P-MOSFET 13 OFF state and the N-MOSFET 14 ON state. As a result, the output data signal $D_{OUT}$ becomes low from high.

As explained above, when the output data signal $D_{OUT}$ is simply changed from low to high or from high to low, the operation speed, and the change of the power supply potential $V_{CC1}$ and the ground potential $V_{SS1}$ are not different between the conventional output buffer circuit and that of the invention, if MOSFETs having the small mutual transfer conductance as used in the conventional output buffer circuit are used therein.

Figure 9:
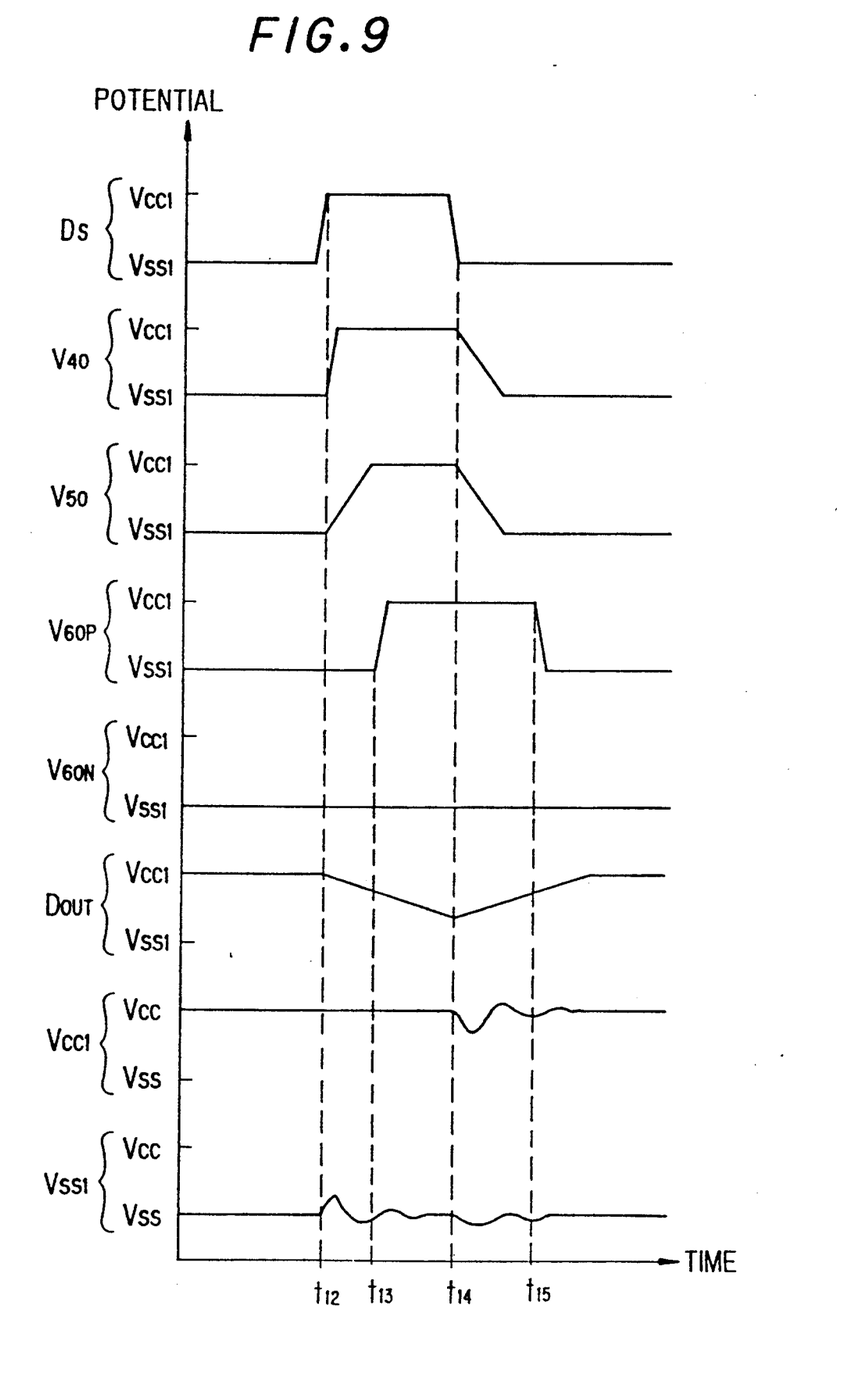

In operation of a case when the data signal $D_S$ changes from the low level $V_{SS1}$ to the high level $V_{CC1}$ at the time $t_{12}$ and to the low level $V_{SS1}$ again at the time $t_{14}$, as shown in FIG. 9, the output data signal $D_{OUT}$ is discharged through the N-MOSFET 14 due to the change of the data signal $D_S$ from low to high. However, the input data signal $D_S$ changes from high to low before the output data signal $D_{OUT}$ is discharged to be the ground potential $V_{SS1}$ at the time $t_{14}$. If the threshold voltage of the inverter circuit 66 is set to be a predetermined low level, the second output potential $V_{6ON}$ of the output potential detecting circuit 60 remains the low potential $V_{SS1}$, so that the N-MOSFET 54 remains OFF state. Therefore, the output potential $V_{50}$ of the inverter circuit 50 changes from the high potential $V_{CC1}$ to the low potential $V_{SS1}$ in a low speed, because the discharge occurs gradually through the resistor 53. As a result, the N-MOSFET 14 does not become OFF state suddenly, so that the sudden change of currents from the ground potential $V_{SS1}$ of the output buffer circuit to the external ground potential $V_{SS}$, which causes the decrease of the ground potential $V_{SS1}$, may be prevented.

Figure 10:
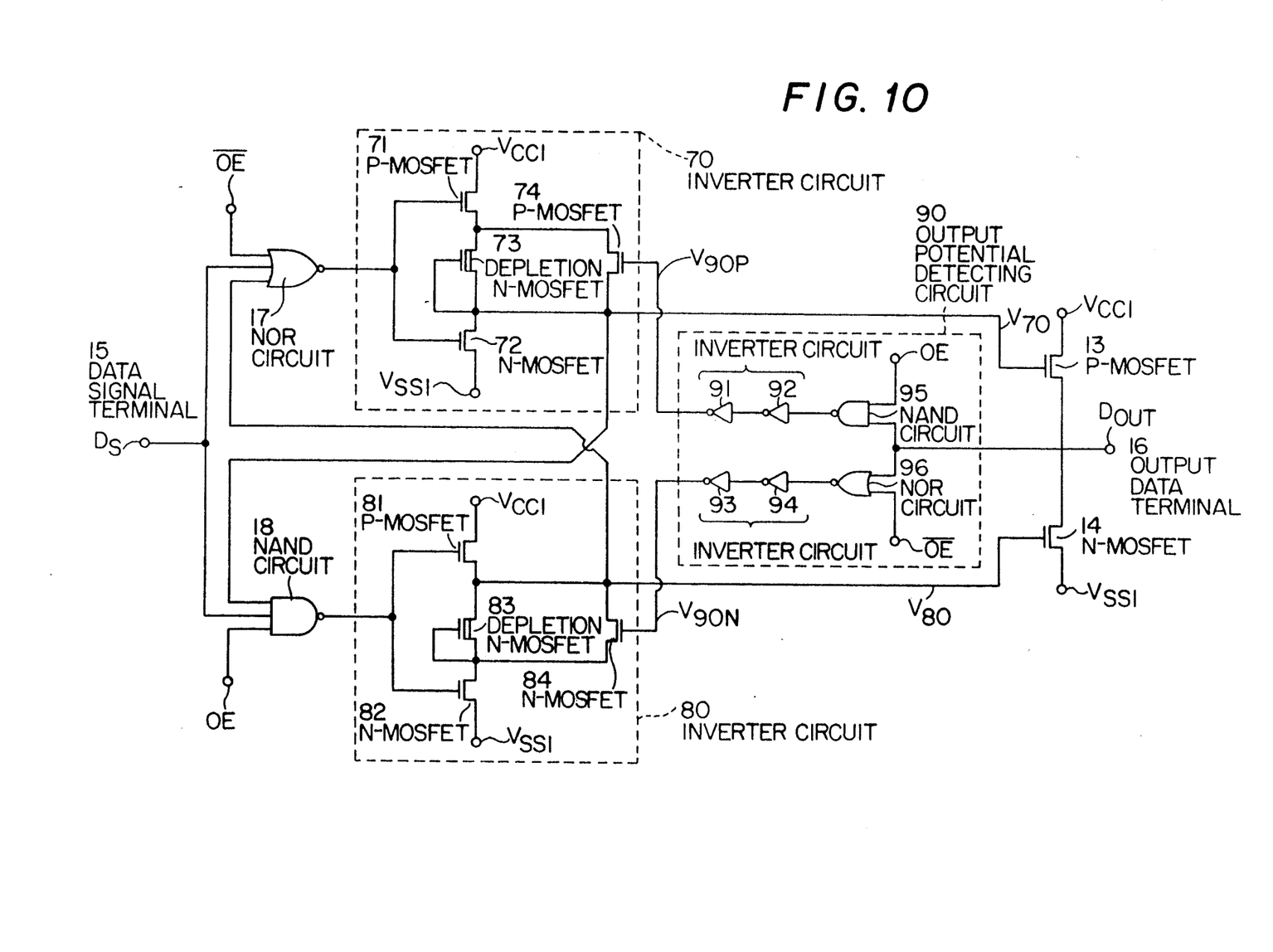
FIG. 10 is a circuitry diagram of an output buffer circuit in a second preferred embodiment according to the invention.

FIG. 10 is a circuitry diagram of an output buffer circuit in the second preferred embodiment according to the invention.

The output buffer circuit comprises a NOR circuit 17, a NAND circuit 18, a P-MOSFET 13, an N-MOSFET 14, inverter circuits 70 and 80, and an output potential detecting circuit 90.

The NOR circuit 17 is supplied with the data signal $D_S$, the output enable signal $\overline{OE}$ and an output of the inverter circuit 80 from which an output potential $V_{50}$ is supplied thereto. The NAND circuit 18 is supplied with the data signal $D_S$, the output enable signal OE and an output of the inverter circuit 70 from which an output potential $V_{70}$ is applied thereto.

The P-MOSFET 13 is connected at a gate to the output of the inverter circuit 70 by which the output potential $V_{70}$ is applied, at a source to a power supply potential $V_{CC1}$, and at a drain to an output data terminal 16 by which an output data signal $D_{OUT}$ is supplied to an external circuit.

The N-MOSFET 14 is connected at a gate to the output of the inverter circuit 80 by which the output potential $V_{80}$ is applied, at a source to the ground potential $V_{SS1}$, and at a drain to the output data terminal 16.

The inverter circuit 70 comprises P-MOSFETs 71 and 74, an N-MOSFET 72, and a depletion N-MOSFET 73. The P-MOSFET 71 is connected at a gate to an output of the NOR circuit 17, at a source to the power supply potential $V_{CC1}$, and at a drain to drain of the depletion N-MOSFET 73 and source of the P-MOSFET 74. The N-MOSFET 72 is connected at a gate to the output of the NOR circuit 17, at a source to the ground potential $V_{SS1}$, and at a drain to the gate of the P-MOSFET 13. The depletion N-MOSFET 73 is connected at a gate and a source to the gate of the P-MOSFET 13, and at a drain to the drain of the P-MOSFET 71 and the source of the P-MOSFET 74. The P-MOSFET 74 is connected at a gate to a first output of the output potential detecting circuit 90 by which a first output potential $V_{9OF}$ is applied, at a source to the drain of the P-MOSFET 71 and the drain of the depletion N-MOSFET 73, and at a drain to the gate of the P-MOSFET 13.

The inverter circuit 80 comprises a P-MOSFET 81, N-MOSFETs 82 and 84, and a depletion N-MOSFET 83.

The P-MOSFEt 81 is connected at a gate to an output of the NAND circuit 18, at a source to the power supply potential $V_{CC1}$, and at a drain to the gate of the N-MOSFET 14. The N-MOSFET 82 is connected at a gate to the output of the NAND circuit 18, at a source to the ground potential $V_{SS1}$, and at a drain to the gate and source of the depletion N-MOSFET 83 and the source of the N-MOSFET 84. The depletion N-MOSFET 83 is connected at the gate and source to the drain of the N-MOSFET 82 and the source of the N-MOSFET 84, and at the drain to the gate of the N-MOSFET 14. The N-MOSFET 84 is connected at a gate to a second output of the output potential detecting circuit 90 by which the second output potential $V_{9ON}$ is applied, at a source to the drain of the N-MOSFET 82 and the gate and source of the depletion N-MOSFET 83, and at a drain to the gate of the N-MOSFET 14.

The output potential detecting circuit 90 comprises first and second serial groups of inverter circuits and a NAND or NOR circuit. The first serial group comprises two inverter circuits 91 and 92 and a NAND circuit 95 connected serially, in which two inputs of the NAND circuit 95 is connected to the output data terminal 16 and a terminal by which the output enable signal OE is supplied, and an output of the inverter circuit 91 is connected to the gate of the P-MOSFET 74. The second serial group comprises two inverter circuits 93 and 94 and a NOR circuit 96 connected serially, in which two inputs of the NOR circuit 96 is connected to the output data terminal 16 and a terminal by which the output enable signal $\overline{OE}$ is supplied, and an output of the inverter circuit 93 is connected to the gate of the N-MOSFET 84.

In this preferred embodiment, the depletion N-MOSFETs 73 and 83 are used in place of the resistors 43 and 53 in the first preferred embodiment. And, the NAND and NOR circuits 95 and 96 are used in place of the inverter circuits 63 and 66, to avoid the wrong operation of the output potential detecting circuit 90 when the output data signal $D_{OUT}$ becomes a middle potential level between the power supply potential $V_{CC1}$ and the ground potential $V_{SS1}$ in OFF state of the output buffer circuit.

Next, operation of the output buffer circuit will be described in conjunction with FIGS. 11 to 13.

Figure 11:
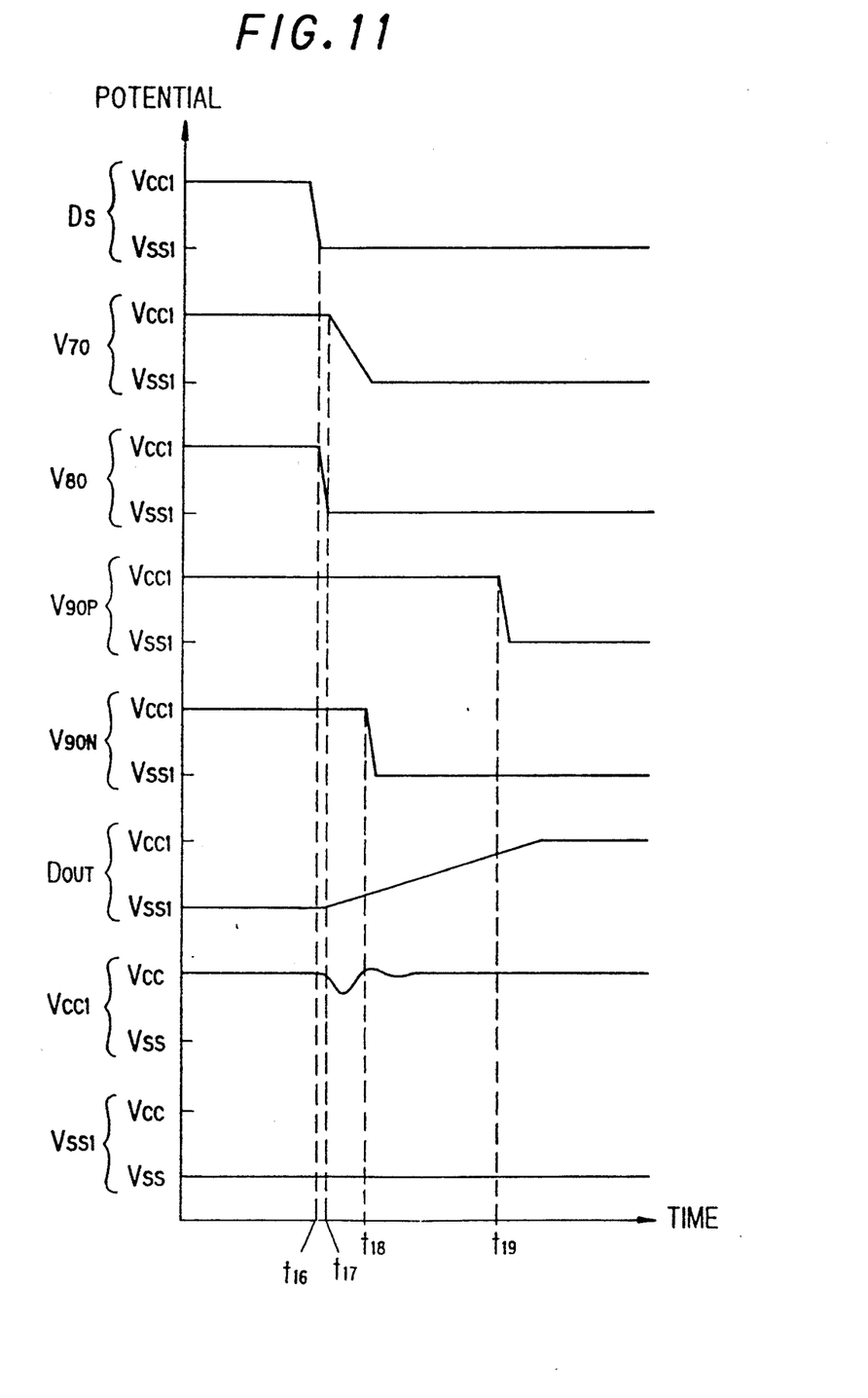
FIGS. 11 to 13 are diagrams of potential waveforms in operation of the second preferred embodiment according to the invention.

In operation, when the data signal $D_S$ changes from the high level $V_{CC1}$ to the low level $V_{SS1}$ at the time $t_{16}$, as shown in FIG. 11, the NAND circuit 18 supplies the input of the inverter circuit 80 with a signal of the high level. On the other hand, the output data signal $D_{OUT}$ is low at an initial state, so that the first and second output potentials $V_{90P}$ and $V_{90N}$ of the output potential detecting circuit 90 are high at an initial state. Therefore, the output potential $V_{80}$ of the inverter circuit 80 becomes low at the time $t_{17}$ to make the N-MOSFET 14 OFF state. By changing the output potential $V_{80}$ of the inverter circuit 80 from high to low, the output of the NOR circuit 17 becomes high, so that the output potential $V_{70}$ of the inverter circuit 70 becomes the low potential $V_{SS1}$ to make the P-MOSFET 13 ON state. As a result, the output data signal $D_{OUT}$ becomes high.

Figure 12:
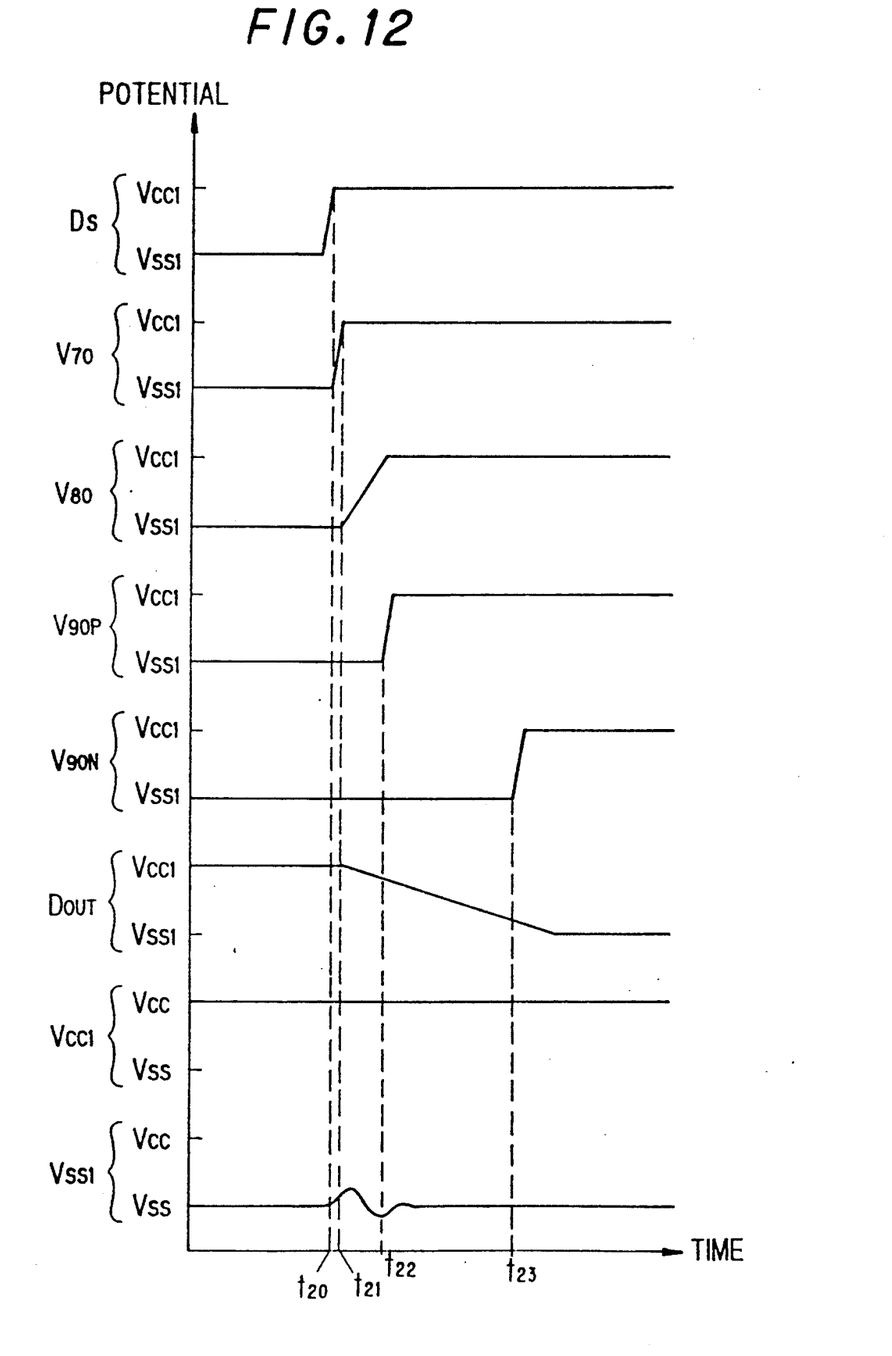

On the contrary, when the data signal $D_s$ changes from the low level $V_{SS1}$ to the high level $V_{CC1}$ at the time $t_{20}$, as shown in FIG. 12, the NOR circuit 17 supplies the input of the inverter circuit 70 with a signal of the low level. On the other hand, the output data signal $D_{OUT}$ is high at an initial state, so that the first and second output potentials $V_{90P}$ and $V_{90N}$ of the output potential detecting circuit 90 are low at an initial state. Therefore, the output potential $V_{70}$ of the inverter circuit 70 becomes high at the time $t_{21}$ to make the P-MOSFET 13 OFF state. By changing the output potential $V_{70}$ of the inverter circuit 70 from low to high, the output of the NAND circuit 18 becomes low, so that the output potential $V_{80}$ of the inverter circuit 80 becomes the high potential $V_{CC1}$ to make the N-MOSFET 14 ON state. As a result, the output data signal $D_{OUT}$ becomes low.

Figure 13:
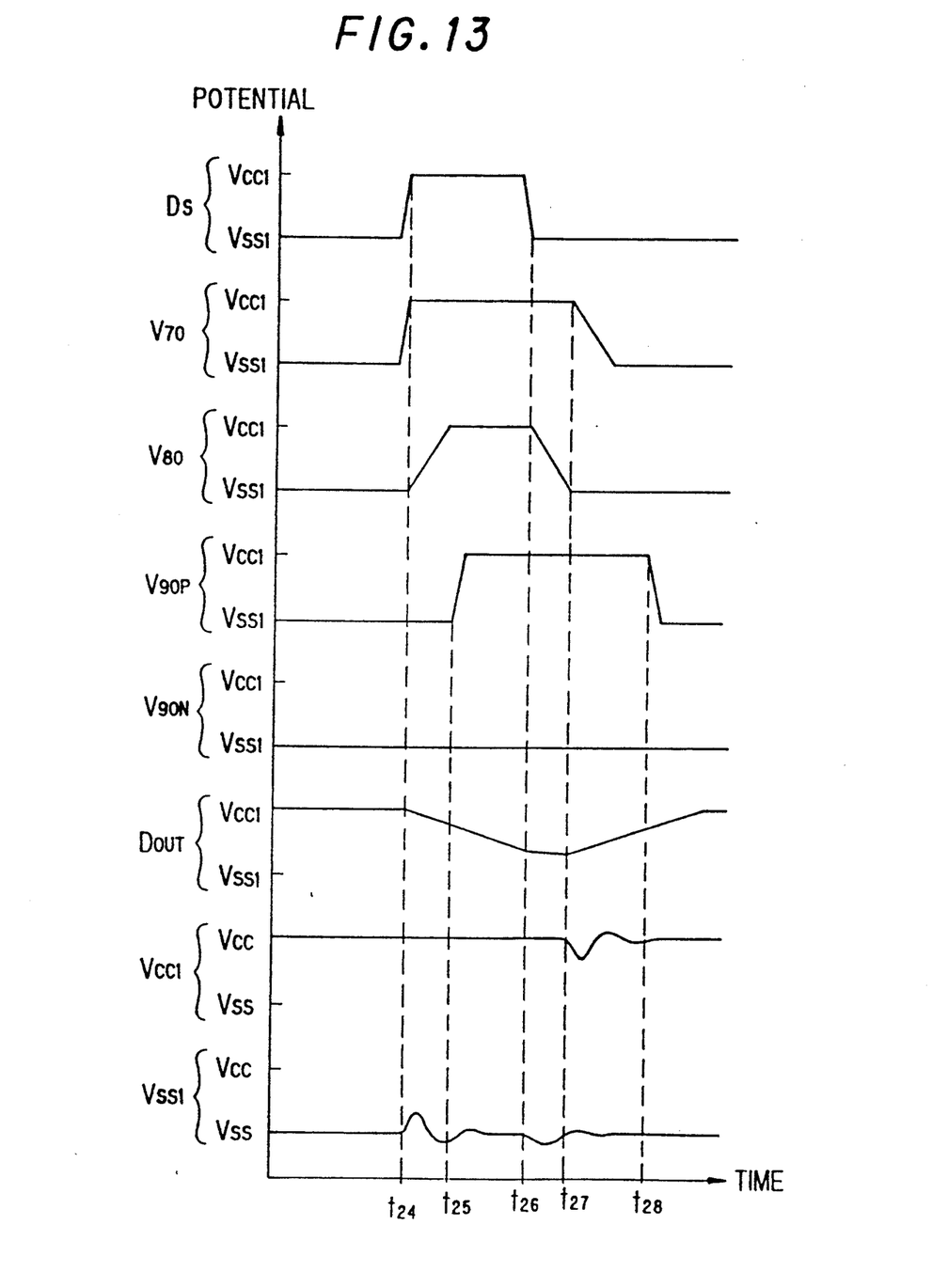

When the data signal $D_S$ changes from the low level $V_{SS1}$ to the high level $V_{CC1}$ at the time $t_{24}$ and to the low level $V_{SS1}$ again at the time $t_{26}$ as shown in FIG. 13, the output data signal $D_{OUT}$ is discharged through the N-MOSFET 14 due to the change of the data signal $D_S$ from low to high. However, the data signal $D_S$ changes from high to low before the output data signal $D_{OUT}$ is discharged to be the ground level $V_{SS1}$ at the time $t_{26}$. If the threshold voltage of the NOR circuit 96 is set to be a predetermined low level, the second output potential $V_{90N}$ of the output potential detecting circuit 90 remains the low potential $V_{SS1}$, so that the N-MOSFET 84 remains OFF state. Therefore, the output potential $V_{80}$ of the inverter circuit 80 changes from the high potential $V_{CC1}$ to the low potential $V_{SS1}$ in a low speed, because the discharge occurs gradually through the depletion N-MOSFET 83. As a result, the N-MOSFET 14 does not become OFF state suddenly, so that the sudden change of currents from the ground potential $V_{SS1}$ of the output buffer circuit to the external ground potential $V_{SS}$ may not occur. On the other hand, by changing the output potential $V_{80}$ of the inverter circuit 80 from high to low, the output of the NOR circuit 17 becomes high, so that the output potential $V_{70}$ of the inverter circuit 70 becomes low to make the P-MOSFET 13 ON state. As a result, the output data signal $D_{OUT}$ becomes high.

In this preferred embodiment, the outputs of the inverter circuit 80 and 90 are supplied to the inputs of the NAND and NOR circuits 17 and 18, respectively, so that the P-MOSFET 13 and the N-MOSFET 14 become ON state simultaneously. Therefore, a current may not flow from the power supply potential $V_{CC1}$ to the ground potential $V_{SS1}$.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. An output buffer circuit, comprising:
   a first MOSFET provided between a first power supply and an output data terminal;
   a second MOSFET provided between a second power supply and said output data terminal;
   a first inverter circuit for supplying a gate of said first MOSFET with a first potential;
   a second inverter circuit for supplying a gate of said second MOSFET with a second potential;
   means for detecting a potential of said output data terminal to generate a detecting signal; and
   means for controlling said first and second inverter circuits in accordance with said detecting signal supplied from said detecting means to avoid sudden change of state in said first or second inverter circuit, including means for delaying a timing of changing said first or second MOSFET from ON state to OFF state, wherein said delaying means is a resistor.

2. An output buffer circuit, comprising:
   a first MOSFET provided between a first power supply and an output data terminal;
   a second MOSFET provided between a second power supply and said output data terminal;
   a first inverter circuit for supplying a gate of said first MOSFET with a first potential;
   a second inverter circuit for supplying a gate of said second MOSFET with a second potential;
   means for detecting a potential of said output data terminal to generate a detecting signal; and
   means for controlling said first and second inverter circuits in accordance with said detecting signal supplied from said detecting means to avoid sudden change of state in said first or second inverter circuit, including means for delaying a timing of changing said first or second MOSFET from ON state to OFF state, wherein said delaying means is a depletion type MOSFET.

3. An output buffer circuit comprising:
a first MOSFET provided between a first power supply and an output data terminal;
a second MOSFET provided between a second power supply and said output data terminal;
a first inverter circuit for supplying a gate of said first MOSFET with a first potential;
a second inverter circuit for supplying a gate of said second MOSFET with a second potential;
means for detecting a potential of said output data terminal to generate a detecting signal; and
means for controlling said first and second inverter circuits in accordance with said detecting signal supplied form said detecting means to avoid sudden change of state in said first or second inverter circuit wherein the first inverter includes a third and fourth MOSFET, and the second inverter includes a fifth and sixth MOSFET, and wherein the means for controlling includes a first resistor coupled between the third and fourth MOSFET and a second resistor coupled between the fifth and sixth MOSFET.

4. An output buffer circuit comprising:
a first MOSFET provided between a first power supply and an output data terminal;
a second MOSFET provided between a second power supply and said output data terminal;
a first inverter circuit for supplying a gate of said first MOSFET with a first potential;
a second inverter circuit for supplying a gate of said second MOSFET with a second potential;
means for detecting a potential of said output data terminal to generate a detecting signal; and
means for controlling said first and second inverter circuits in accordance with said detecting signal supplied form said detecting means to avoid sudden change of state in said first or second inverter circuit wherein the first inverter includes a third and fourth MOSFET, and the second inverter includes a fifth and sixth MOSFET, and wherein the means for controlling includes a first depletion type MOSFET coupled between the third and fourth MOSFET and a second depletion type MOSFET coupled between the fifth and sixth MOSFET.

* * * * *